US012712006B2

United States Patent
(12)

Chen et al.

(10) Patent No.: US 12,712,006 B2

(45) Date of Patent: Aug. 18, 2026

(54) READING METHOD AND READING CIRCUIT OF FRAM

(71) Applicant: ZHEJIANG UNIVERSITY, Hangzhou (CN)

(72) Inventors: Bing Chen, Hangzhou (CN); Xuecheng Cui, Hangzhou (CN); Dong Liu, Hangzhou (CN); Ran Cheng, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 167 days.

(21) Appl. No.: 18/434,848

(22) Filed: Feb. 7, 2024

(65) Prior Publication Data

US 2024/0177758 A1 May 30, 2024

Related U.S. Application Data

(63) Continuation of application No. PCT/CN2023/077128, filed on Feb. 20, 2023.

(30) Foreign Application Priority Data

Aug. 12, 2022 (CN) ........................ 202210966484.X

(51) Int. Cl.
*G11C 11/22* (2006.01)

(52) U.S. Cl.
CPC ...... *G11C 11/2273* (2013.01); *G11C 11/2255* (2013.01)

(58) Field of Classification Search
CPC . G11C 11/2273; G11C 11/2255; G11C 11/22; G11C 11/221; G11C 7/06

(Continued)

(56) References Cited

U.S. PATENT DOCUMENTS 6,088,257 A 7/2000 Jeon et al.
2023/0138195 A1* 5/2023 Park ...................... G06F 3/0619 711/154

FOREIGN PATENT DOCUMENTS

CN 114594819 A 6/2022
CN 115440263 A 12/2022

(Continued)

OTHER PUBLICATIONS

International Search Report (PCT/CN2023/077128); Date of Mailing: May 24, 2023.

*Primary Examiner* — Huan Hoang

(74) *Attorney, Agent, or Firm* — Wiersch Law Group

(57) ABSTRACT

The present application discloses a reading method and a reading circuit of FRAM. The method comprises: converting changing rates of voltage signals on bit lines of a memory cell and a reference cell in a FRAM array to be consistent with magnitudes of corresponding voltages by respective differential circuits, inputting the voltage signals into a sense amplifier, and reading a voltage difference by the sense amplifier. A reading circuit using this method comprises two differential circuit modules and one sense amplifier; the differential circuit module is used to differentiate the voltage signals on the bit lines with respect to time to obtain the change rates of the voltage signals on the bit lines with respect to time; the sense amplifier is used to amplify the signal difference processed by the differential circuit modules and convert the information stored in a memory cell into “0” and “1”.

6 Claims, 4 Drawing Sheets

(58) Field of Classification Search
USPC .......................................................... 365/145
See application file for complete search history.

(56) References Cited

FOREIGN PATENT DOCUMENTS

| | | | |
|---|---|---|---|
| JP | 2005259223 | A | 9/2005 |
| JP | 2021197196 | A | 12/2021 |

* cited by examiner

READING METHOD AND READING CIRCUIT OF FRAM

CROSS-REFERENCE TO RELATED APPLICATIONS

The present application is a continuation of International Application No. PCT/CN2023/077128, filed on Feb. 20, 2023, which claims priority to Chinese Application No. 202210966484.X, filed on Aug. 12, 2022, the contents of both of which are incorporated herein by reference in their entireties.

TECHNICAL FIELD

The present disclosure relates to the technical field of semiconductor memories and in particular, to a novel reading method and a reading circuit of FRAM.

BACKGROUND

Ferroelectric Random Access Memory (FRAM) is a new type of nonvolatile random access memory. Its structure is simple, the memory cell has a 1T1C structure, which has good compatibility with the standard CMOS process, and has the characteristics of low working voltage, fast reading and writing speed, and long service life. Its information memory cell is a ferroelectric capacitor made of one or more metal oxides, and this ferroelectric capacitor has ferroelectricity. Under different write voltages, the polarization directions of FRAM's ferroelectric capacitors are different, and these two different polarization states will not disappear with the disappearance of write voltages.

By applying write voltage, the polarization direction of the ferroelectric capacitor in the FRAM can be changed, and information "0" or "1" can be stored. In the traditional FRAM, the reading of memory information is to apply a reading voltage to the FRAM, and convert the memory information with different polarization directions into current signals or voltage signals that can be recognized by external circuits for reading.

The schematic diagram of an existing FRAM reading circuit is shown in FIG. 1, which is read by some current-sense amplifiers or voltage-sense amplifiers. The principle of the existing FRAM reading circuit is to add a read voltage $V_r$ to the Plate Lines (PLs) of the memory cell and the reference cell simultaneously. The $V_r$ is equal to the write voltage, and the bit line (BL) is precharged to be 0V. At this time, according to the polarization state of memory cells of the FRAM, different current signals are generated on the bit line. This existing FRAM reading method needs a reference cell, and the polarization state of the ferroelectric capacitor of the reference cell may be configured to a polarization state in a fixed direction. When the read voltage $V_r$ is applied to the memory cell, the same read voltage $V_r$ is applied to the reference cell. The input impedance of the sense amplifier is large, and it senses the voltage signals on BLs of the two cells. Through a sense amplifier circuit, the information in the original memory cell is read out.

Although the above-mentioned existing reading method can successfully read the memory cells of the FRAM, there are some disadvantages: first, the detected voltage difference between the memory cell and the reference cell must be as large as possible to meet the design requirements of subsequent sense amplifiers, because there will be a lot of noise in the FRAM array circuit in the chip, which easily affects the reading results; second, in order to reach this suitable and large enough voltage difference, it will take some time to wait, which causes a long reading delay, thereby increasing power consumption and cost.

SUMMARY

In view of the problems existing in the prior art, the present application provides a novel reading method of FRAM and a reading circuit thereof, which have the advantages that the memory information is read by the rising rate of the voltage signal instead of directly depending on the difference of the read voltage signals. FRAM memory cells with different polarization states will lead to obvious differences in the rising rate of voltage signals on bit lines, thus further realizing the reading of memory information.

The object of the present application is achieved through the following technical solution:

According to a first aspect of this specification, a novel reading method of FRAM is provided, which includes the following steps of: converting changing rates of voltage signals on bit lines of a memory cell and a reference cell in a FRAM array to be consistent with magnitudes of corresponding voltages by respective differential circuits, inputting the voltage signals into a sense amplifier, and reading a voltage difference by the sense amplifier.

Further, first, the bit lines (BLs) of the memory cell and the reference cell are precharged to be 0V, a reading voltage is applied to plate lines (PLs) of the memory cell and the reference cell at a reading time t0, respectively, and memory information is read within an optimal voltage change rate difference window obtained in a pre-experiment.

Further, when the memory information "0" or "1" is written into the memory cell of the FRAM array, polarization states of a ferroelectric capacitor in the memory cell are different; due to a parasitic resistance and a parasitic capacitance on the BLs, when the memory information is read, the different polarization states of the ferroelectric capacitor lead to different rates of voltage rise on the BLs; a difference in the rates of voltage rise is converted into different voltage signals by the differential circuit, and then a voltage signal difference converted by the memory cell and the reference cell is amplified by the sense amplifier, and at this time, the information "0" or "1" stored in the memory cell can be read out.

Further, the switch of the polarization state of the ferroelectric capacitor in the memory cell of the FRAM array generates a large polarization current, resulting in a large rate of voltage rise on the BL; on the contrary, when the polarization state of the ferroelectric capacitor is not switched, the voltage on the corresponding BL rises slowly, and the memory information is read by detecting the rate of voltage rise.

Further, according to a second aspect of this specification, provided is a reading circuit by using the method according to the first aspect; the circuit includes a first differential circuit module, a second differential circuit module and a sense amplifier.

An input end of the first differential circuit module is connected to a bit line (BL) corresponding to a memory cell, storing information to be read, in a FRAM array, and an output end of the first differential circuit module is connected to one of input ends of the sense amplifier.

An input end of the second differential circuit module is connected to a bit line (BL) of a reference cell corresponding to the memory cell in the FRAM array, and an output end of the second differential circuit module is connected to the other input end of the sense amplifier.

An output end of the sense amplifier outputs the memory information.

Further, the two differential circuit modules have identical circuits; one differential circuit module differentiates voltage signals on the bit line of the memory cell and the other differential circuit module differentiates voltage signals on the bit line of the reference cell.

Further, the sense amplifier senses and amplifies a voltage signal difference between the two cells after being processed by the differential circuit modules, and different voltage signals input by two input ends of the sense amplifier respectively represent the change rates of the voltage signals on the bit lines of the memory cell and the reference cell. The present application has the advantages that the information stored in the memory cell of the FRAM can be read successfully; reading can be realized only if there is an upward trend of the voltage signal on the BL, which reduces the delay of reading, reduces the power consumption of reading and greatly reduces the cost; and the reading method of the present application uses fewer devices, is relatively simple, and is easy to put into market application.

DESCRIPTION OF EMBODIMENTS

In order to make the object, technical solution and advantages of the embodiment of the present application more clear, the present application will be described clearly and completely with the attached drawings. Obviously, the described embodiment is a part of the embodiment of the present application, but not the whole embodiment. Based on the embodiments in the present application, all other embodiments obtained by ordinary technicians in the field without creative labor belong to the scope of protection of the present application.

The present application provides a reading method of FRAM, which includes the following steps: converting changing rates of voltage signals on bit lines of a memory cell and a reference cell in a FRAM array into corresponding voltage sizes by respective differential circuits to be jointly inputted into a sense amplifier, and reading voltage differences by the sense amplifier.

Figure 1:
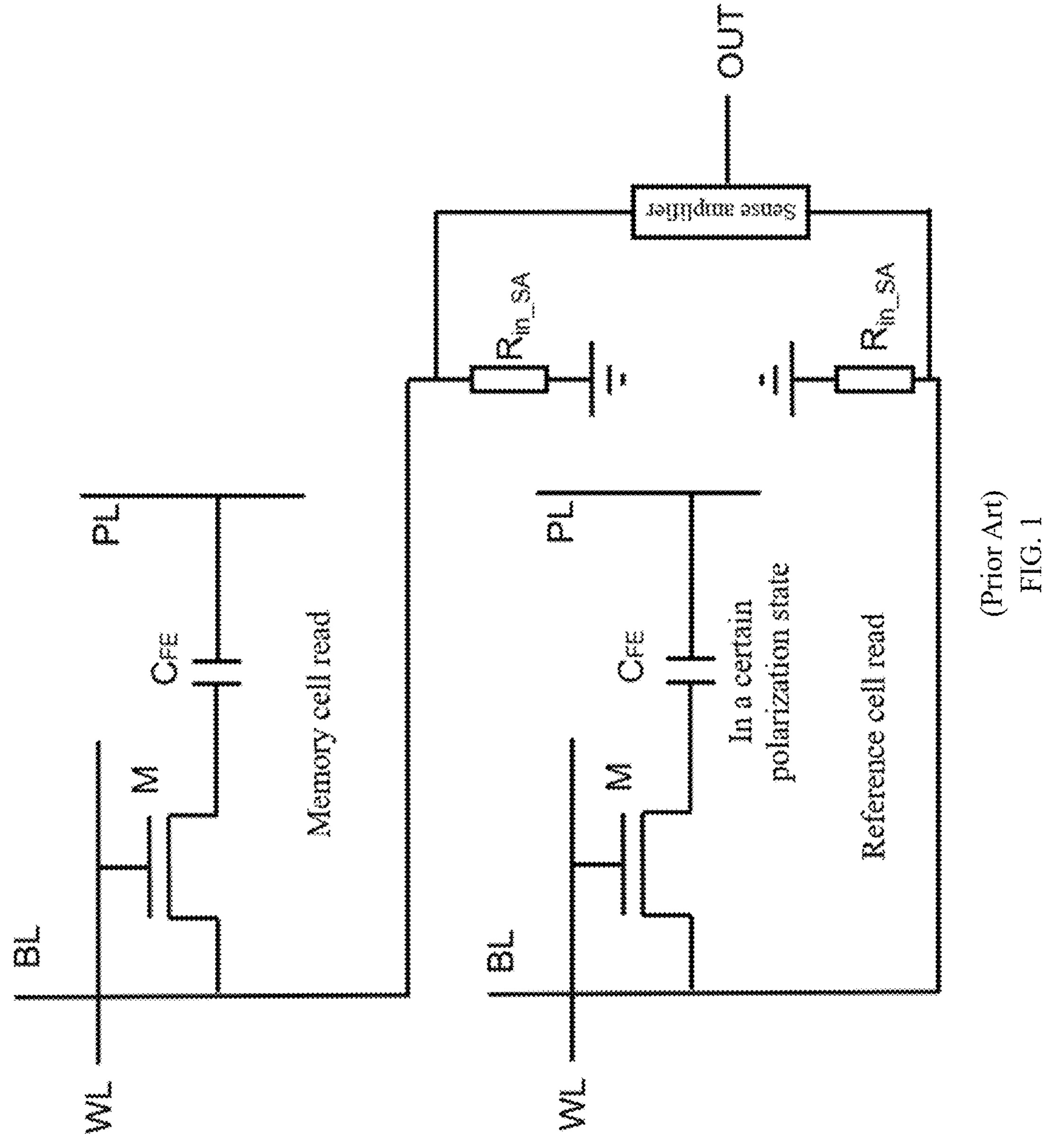
FIG. 1 is a schematic diagram of a conventional reading circuit of a FRAM.
Figure 2:
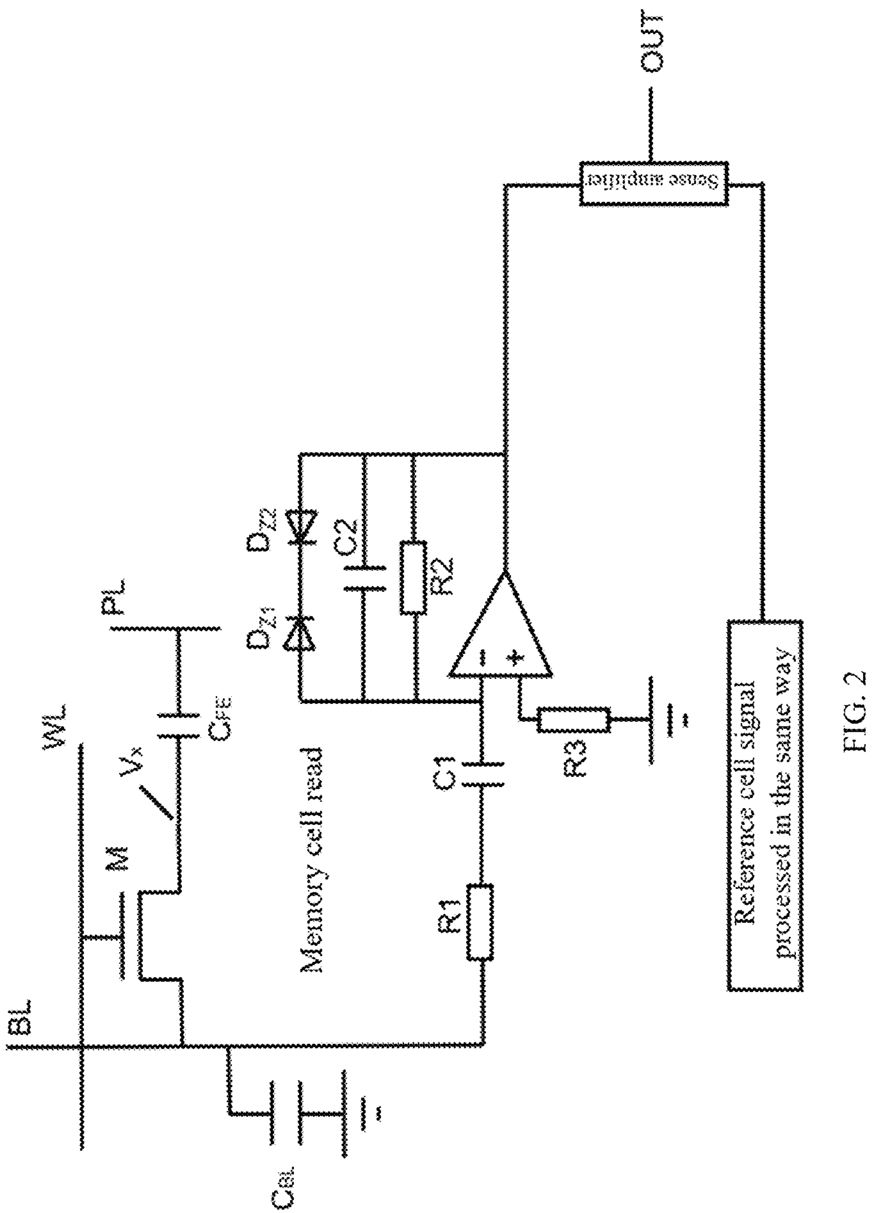
FIG. 2 is a novel reading circuit diagram of a FRAM provided by an embodiment of the present application.

FIG. 2 is a schematic diagram of a novel FRAM reading circuit using a new method of the present application. The embodiment here mainly includes a differential circuit module and a sense amplifier, which can realize the reading of information of a FRAM memory cell. The function of the sense amplifier is to amplify the difference between the signals processed by the memory cell and the signal processed by the reference cell. Because the signals processed by the differential circuit module can not reach the high level $V_{DD}$ and the low level GND (which can be used as a follow-up circuit), this sense amplifier is indispensable. For example, when the signals processed by the differential circuit module are 1/10 and 1/100 of $V_{DD}$, the sense amplifier can convert these two signals into a high-level logic "1" and a low-level logic "0".

In one embodiment, the differential circuit module is mainly composed of an integrated operational amplifier, three resistors, two capacitors and two diodes, as shown in FIG. 2, in which $R_1$ mainly limits the input current, the diode limits the voltage swing of the output tube, so that the amplifier tube of the integrated operational amplifier works in the amplification region, and $C_2$ is a small-capacity capacitor, which mainly plays the role of phase compensation. The output voltage of the differential circuit module has an approximate differential relationship with the input voltage.

Figure 3:
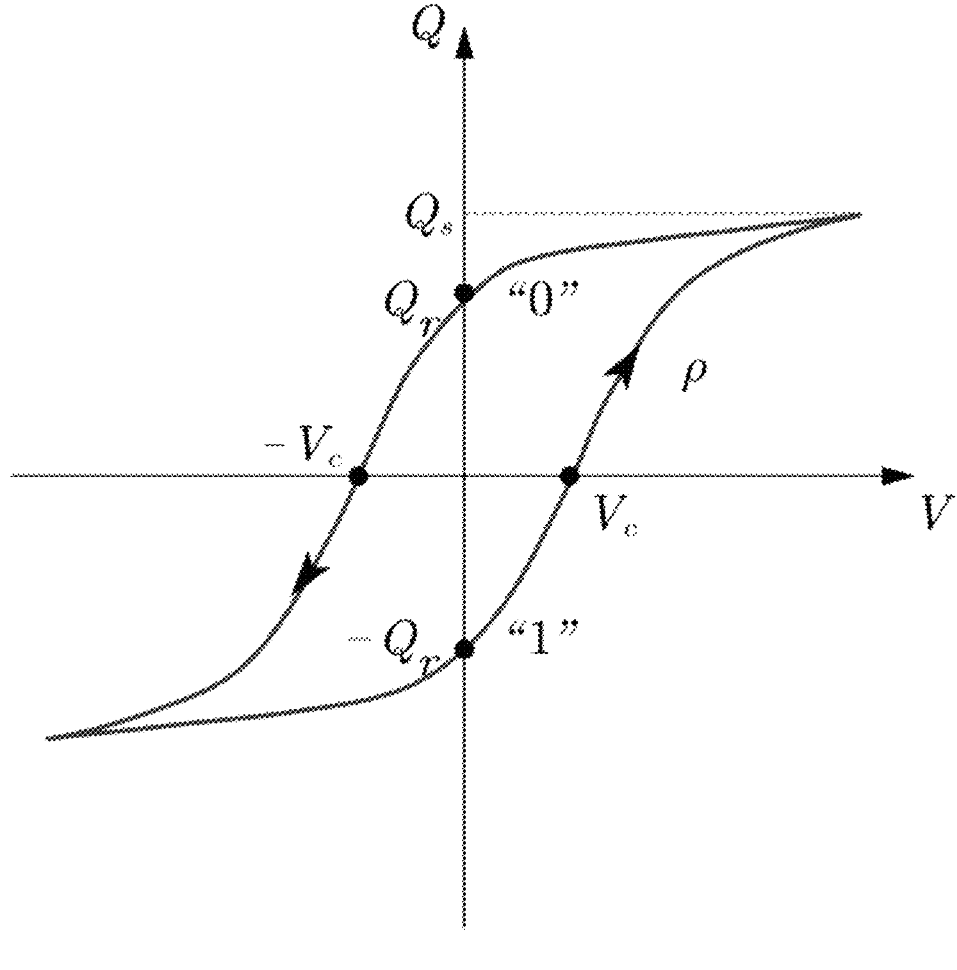
FIG. 3 is a hysteresis loop diagram of ferroelectric provided by an embodiment of the present application.

FIG. 3 is a hysteresis loop diagram of a ferroelectric capacitor, and the process of polarization switch is the process from "$-Q_r$" to "$Q_s$" or from "$Q_r$" to "$-Q_s$" in the figure. The abscissa V is the voltage applied on the ferroelectric capacitor, and the ordinate Q is the polarized charge on the ferroelectric capacitor, $Q_r$ is the remanent polarized charge, and $Q_s$ is the saturation polarized charge. For example, the polarization state of "1" is stored in the figure, and after a positive reading voltage is applied, polarization switch will occur, resulting in a polarization current, which will make the voltage on BL rise rapidly and greatly. On the contrary, the polarization state of "0" is store, and after a positive reading voltage is applied, polarization switch will not occur, but the process of changing from "$Q_r$" to "$Q_s$" will also produce a small amount of charge fluctuation, thus generating a small amount of current. This current will also cause the voltage signal on the BL to rise, but the amplitude and rate of the rise will be smaller than that caused by polarization switch.

Figure 4:
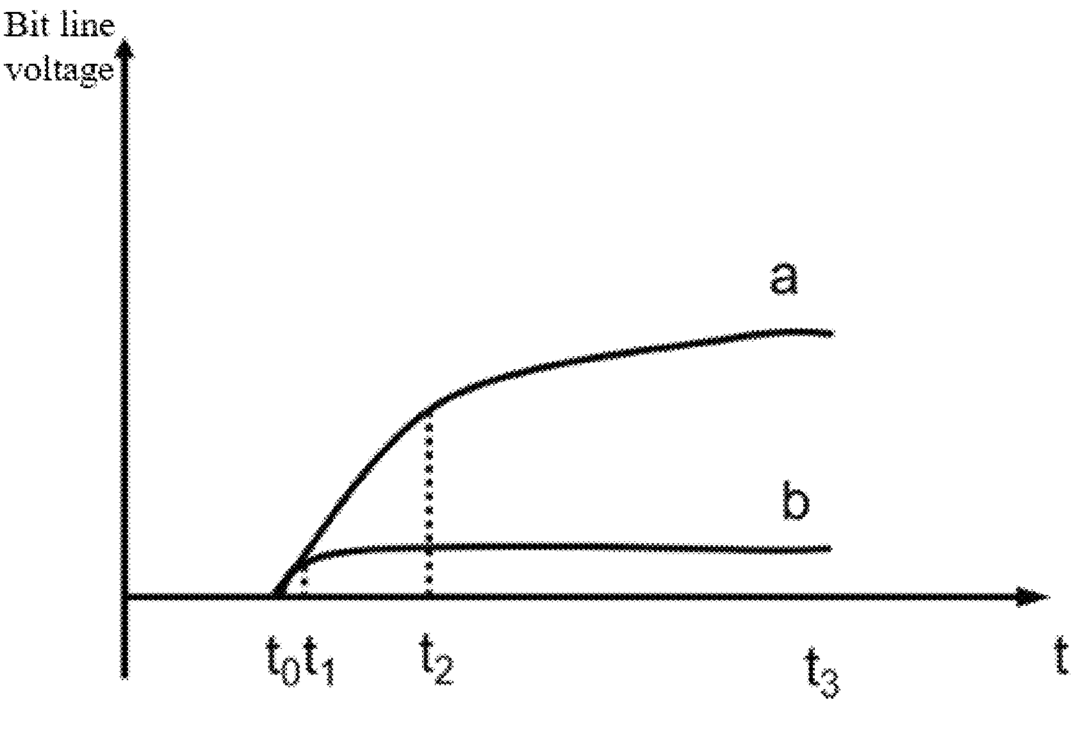
FIG. 4 is a waveform diagram of the voltage on a BL during the reading operation provided by the embodiment of the present application.

FIG. 4 shows the variation of voltage on the BL with respect to time, reflecting the rising rate of voltage signal on BL. Due to the existence of parasitic resistance and parasitic capacitance on the BL, when the polarized charge on the ferroelectric capacitor charges the BL, it will cause delay. As shown in FIG. 4(*a*), there are more polarized charges generated by polarization switch, so the voltage on the BL rises faster and with a higher amplitude. However, the ferroelectric capacitor without polarization switch, as shown in FIG. 4(*b*), produces a small amount of charge, so the voltage signal on the BL rises slowly and the rising amplitude is lower. Before time $t_0$, the BL is precharged to 0V, and a reading voltage is applied to PL at time $t_0$, and there will be a large rising rate difference window from time $t_1$ to time $t_2$, which is used as the reading in the present application.

As can be seen from FIG. 4, in this embodiment, the difference in the rate of voltage rise on the BL from time $t_1$ to time $t_2$ is selected for sensing amplification, and finally the memory information is read out. Obviously, the selected reading time will be earlier than the traditional reading method, which can reduce the time for reading the memory information.

Figure 5:
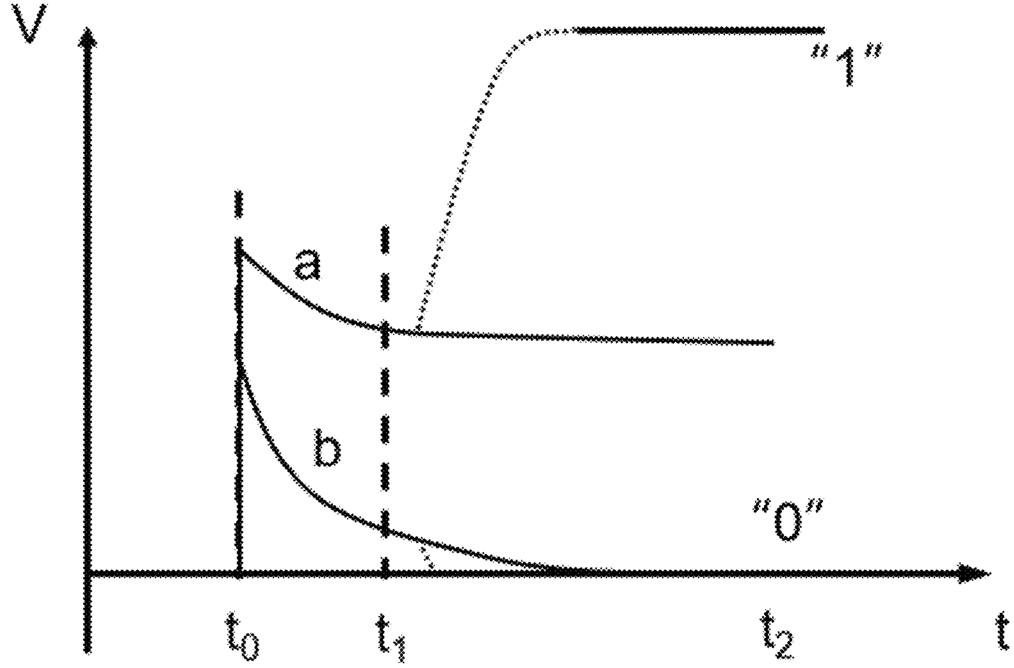
FIG. 5 is a voltage signal diagram of the bit line voltage signal in FIG. 4 after differential processing.

FIG. 5 is a voltage signal diagram of the voltage signal on the bit line in FIG. 4 after differential processing, and a and b in FIG. 5 correspond to a and b in FIG. 4. As mentioned above, the voltage on the BL starts to rise at time $t_0$, and after being processed by the differential circuit module, it becomes the voltage waveform in FIG. 5. a in FIG. 5 is a voltage waveform with polarization switch, and b is a voltage waveform with no polarization switch. There is a big difference in the size of the voltage signal from time $t_1$ to time $t_2$. The memory information can be read by outputting the difference in the size of the voltage signals by the sense amplifier.

For convenience, the state of the reference cell may be set to "0", that is, the polarization state will not switch under the forward voltage. If the memory cell stores information "1", polarization switch will occur, as shown in FIG. 5(*a*), and finally the information "1" will be read out. If the memory cell stores information "0", then polarization switch will not occur, as shown in FIG. 5(*b*), and finally the information "0" will be read out.

At this point, the reading process of the memory information of the memory cell in the FRAM is completed.

Obviously, the novel FRAM reading circuit in the embodiment of the present application is relatively simple, effectively reduces the reading delay, has low power consumption, and has a very good prospect and market in the memory field.

The above is only the preferred embodiment of one or more embodiments of this specification, and it is not used to limit one or more embodiments of this specification. Any modification, equivalent substitution, improvement and the like made within the spirit and principle of one or more embodiments of this specification should be included in the scope of protection of one or more embodiments of this specification.

What is claimed is:

1. A reading method of a ferroelectric random access memory (FRAM), comprising: converting changing rates of voltage signals on bit lines of a memory cell and a reference cell in a FRAM array to be consistent with magnitudes of corresponding voltages by respective differential circuits, inputting the voltage signals into a sense amplifier, and reading a voltage difference by the sense amplifier;

wherein the bit lines (BLs) of the memory cell and the reference cell are precharged to be 0V, a reading voltage is applied to plate lines (PLs) of the memory cell and the reference cell at a reading time to, respectively, and memory information is read within an optimal voltage change rate difference window obtained in a pre-experiment.

2. The reading method according to claim 1, wherein when the memory information "0" or "1" is written into the memory cell of the FRAM array, polarization states of a ferroelectric capacitor in the memory cell are different; due to a parasitic resistance and a parasitic capacitance on the BLs, when the memory information is read, the different polarization states of the ferroelectric capacitor lead to different rates of voltage rise on the BLs; a difference in the rates of voltage rise is converted into different voltage signals by the differential circuit, and then a voltage signal difference converted by the memory cell and the reference cell is amplified by the sense amplifier, the information "0" or "1" stored in the memory cell is capable of being read out.

3. The reading method according to claim 1, wherein a switch of the polarization state of the ferroelectric capacitor in the memory cell of the FRAM array generates a large polarization current, resulting in a large rate of voltage rise on the BL; when the polarization state of the ferroelectric capacitor is not switched, the voltage on the corresponding BL rises slowly, and the memory information is read by detecting the rate of voltage rise.

4. A reading circuit, comprising a first differential circuit module, a second differential circuit module, and a sense amplifier;

wherein the reading circuit is implemented by using a reading method of a ferroelectric random access memory (FRAM), and the reading method comprises: converting changing rates of voltage signals on bit lines of a memory cell and a reference cell in a FRAM array to be consistent with magnitudes of corresponding voltages by respective differential circuits, inputting the voltage signals into the sense amplifier, and reading a voltage difference by the sense amplifier;

wherein the bit lines (BLs) of the memory cell and the reference cell are precharged to be 0V, a reading voltage is applied to plate lines (PLs) of the memory cell and the reference cell at a reading time to, respectively, and memory information is read within an optimal voltage change rate difference window obtained in a pre-experiment;

wherein an input end of the first differential circuit module is connected to a bit line (BL) corresponding to a memory cell, storing information to be read, in the FRAM array, and an output end of the first differential circuit module is connected to one of input ends of the sense amplifier;

an input end of the second differential circuit module is connected to a bit line (BL) of a reference cell corresponding to the memory cell in the FRAM array, and an output end of the second differential circuit module is connected to the other input end of the sense amplifier;

an output end of the sense amplifier outputs the read memory information.

5. The reading circuit according to claim 4, wherein the first differential circuit module and the second differential circuit module have identical circuits; one of the first differential circuit module and the second differential circuit module differentiates voltage signals on the bit line of the memory cell, and the other of the first differential circuit module and the second differential circuit module differentiates voltage signals on the bit line of the reference cell.

6. The reading circuit according to claim 4, wherein the sense amplifier senses and amplifies a voltage signal difference, between the memory cell and the reference cell, processed by the differential circuit modules, and different voltage signals input by two input ends of the sense amplifier represent change rates of the voltage signals on the bit lines of the memory cell and the reference cell, respectively.

* * * * *